(12) United States Patent
Buckholtz et al.

(10) Patent No.: US 7,306,849 B2
(45) Date of Patent: Dec. 11, 2007

(54) METHOD AND DEVICE TO CLEAN PROBES

(75) Inventors: Christopher C. Buckholtz, Livermore, CA (US); Eric T. Watje, Santa Clara, CA (US)

(73) Assignee: FormFactor, Inc., Livermore, CA (US)

( * ) Notice: Subject to any disclaimer, the term of this patent is extended or adjusted under 35 U.S.C. 154(b) by 221 days.

(21) Appl. No.: 10/186,396

(22) Filed: Jul. 1, 2002

(65) Prior Publication Data

US 2004/0000325 A1    Jan. 1, 2004

(51) Int. Cl.
*B32B 9/04* (2006.01)
*B24B 49/00* (2006.01)

(52) U.S. Cl. .................. 428/411.1; 156/242; 451/527; 451/9

(58) Field of Classification Search ................ 428/447, 428/411.1; 136/6, 18, 25.4; 156/242; 451/527, 451/9
See application file for complete search history.

(56) References Cited

U.S. PATENT DOCUMENTS

| 6,682,893 B2 * | 1/2004 | Taylor et al. | 435/6 |
| 6,757,116 B1 * | 6/2004 | Curtiss et al. | 360/15 |
| 6,777,966 B1 * | 8/2004 | Humphrey et al. | 324/757 |

* cited by examiner

*Primary Examiner*—Bruce H. Hess
*Assistant Examiner*—Lawrence D. Ferguson
(74) *Attorney, Agent, or Firm*—N. Kenneth Burraston

(57) ABSTRACT

A probe cleaning system automatically detects a surface of a probe cleaning device during a cleaning process by providing a predetermined finish on the surface of the probe cleaning device. The predetermined finish can include a textured or machined finish or a marking, such that the predetermined finish provides contrast against the surface. Cameras in the system automatically focus on the surface, with the predetermined finish. This in-focus condition is related to a distance between probes and the surface. Once an in-focus condition is determined, the system performs an automated cleaning process by interacting the probes with the probe cleaning device.

26 Claims, 5 Drawing Sheets

METHOD AND DEVICE TO CLEAN PROBES

BACKGROUND OF THE INVENTION

1. Field of the Invention

This invention relates generally to non-abrasive cleaning devices used to clean probes of a testing device in a testing system.

2. Related Art

Microelectronic testing systems may generate erroneous results if probes are not relatively clean while testing. Some probe cleaning devices include a substrate with gel layer. The probes are inserted into the gel layer and the gel removes particles on the probes. However, this probe cleaning device may not completely clean the probes. To solve this problem, other probe cleaning devices have added an abrasive layer between the gel layer and the substrate. The abrasive layer causes the probes to move laterally after passing through the gel, which results in a more thorough cleaning of the probes.

While the use of the gel layer or the gel and abrasive layers solves one problem, the use of a gel having a clear surface creates another problem. First, regardless of whether the surface of a gel layer is clear, translucent, opaque, or something in between, it is difficult for a camera to automatically focus on the topmost clear surface of a cleaning device. For example, the camera may focus on an underlying substrate layer or an abrasive layer in the cleaning device. This is significant because the automatic focus operation of a camera is often relied upon to position a cleaning device relative to probes at the initiation of a cleaning cycle. To account for the actual location at which the camera focuses, a human operator may enter a number corresponding to the gel layer or gel and abrasive layer thickness. Basically, an educated guess or manual measurement is made as to the thickness of the gel layer or gel and abrasive layers and a tolerance factor is entered into the testing system. If the thickness or tolerance factors are off, the probes can be damaged during cleaning. Further, the inputting of such thickness and/or tolerance values for different types of cleaning devices is time consuming and expensive.

SUMMARY OF THE INVENTION

Embodiments of the present invention provide a system including a probe card having probes and a cleaning wafer that cleans the probes when brought into contact with the probes during a cleaning process. The cleaning wafer has a surface with a predetermined finish that allows a camera to automatically focus on the surface during the cleaning process. Other embodiments of the present invention provide a probe cleaning device including a substrate layer and a gel layer coupled to the substrate layer. The gel layer has a surface with a predetermined finish that allows a camera to automatically focus on the surface during calibration of a cleaning process. The probe cleaning device can also include an abrasive layer between the gel layer and the substrate.

Still other embodiments of the present invention provide a method of making a cleaning device including the step of manufacturing a mold having a mold surface that provides a predetermined surface finish. The method further includes the steps of manufacturing a cleaning material with the mold such that a surface of the cleaning material includes the predetermined surface finish. The predetermined surface finish allows a camera to automatically focus on the surface during a cleaning process. The method further includes the step of coupling another surface of the cleaning material to a substrate, the another surface being opposite to the first surface.

Still further embodiments of the present invention provide a method of cleaning probes. The method includes the steps of placing a cleaning wafer having a surface that provides contrast in a field of view of a camera and controlling the cleaning wafer and the camera so that the camera detects an in-focus condition. The in-focus condition is where the surface at a predetermined position is in-focus within the field of view of the camera. The method further includes the steps of initiating a probe cleaning cycle once the camera has detected the in-focus condition. During the probe cleaning cycle probes are brought into contact with at least the surface of the cleaning wafer based on the predetermined position of the surface relative to the probes. One advantage of the present invention is that cleaning devices are more reliably positioned with respect to a testing system. Further, this positioning can be automated. The surface with a predetermined finish allows a camera to automatically focus at the topmost surface even across different types of cleaning devices having different layers and different layer thicknesses.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
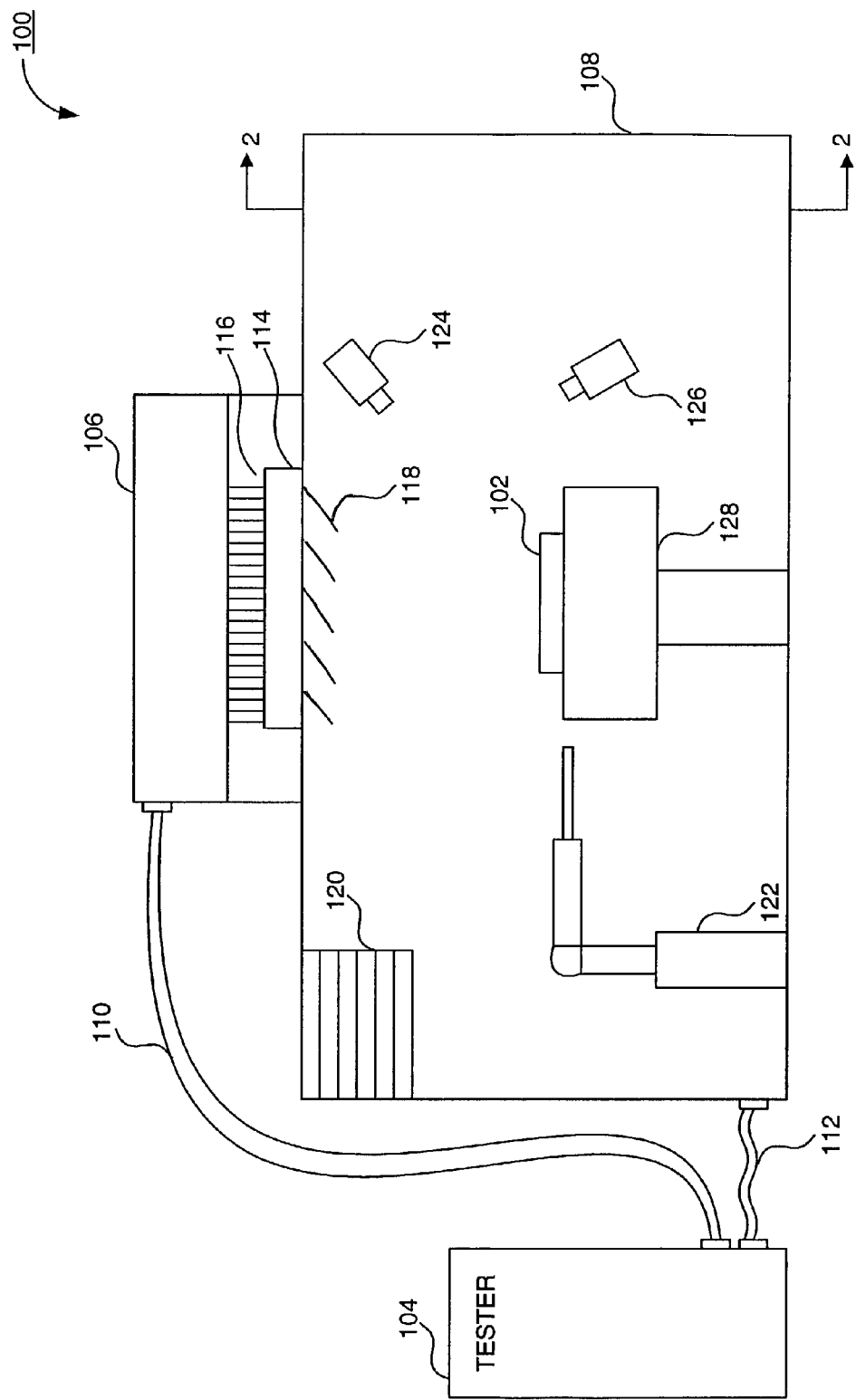
FIG. 1 shows a front view of an example testing system according to embodiments of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Embodiments of the present invention allow a probe cleaning system to automatically detect a surface of a probe cleaning device during a cleaning process by providing a predetermined finish on the surface of the probe cleaning device. The predetermined finish can include a textured or machined finish or a marking, such that the predetermined finish provides contrast against the surface. Cameras in the system automatically focus on the surface, based on the predetermined finish, to determine a distance between probes and the surface. Once determined, the system performs an automated cleaning process by interacting the probes with the probe cleaning device.

Substrate Testing System and Operation

Figure 2:
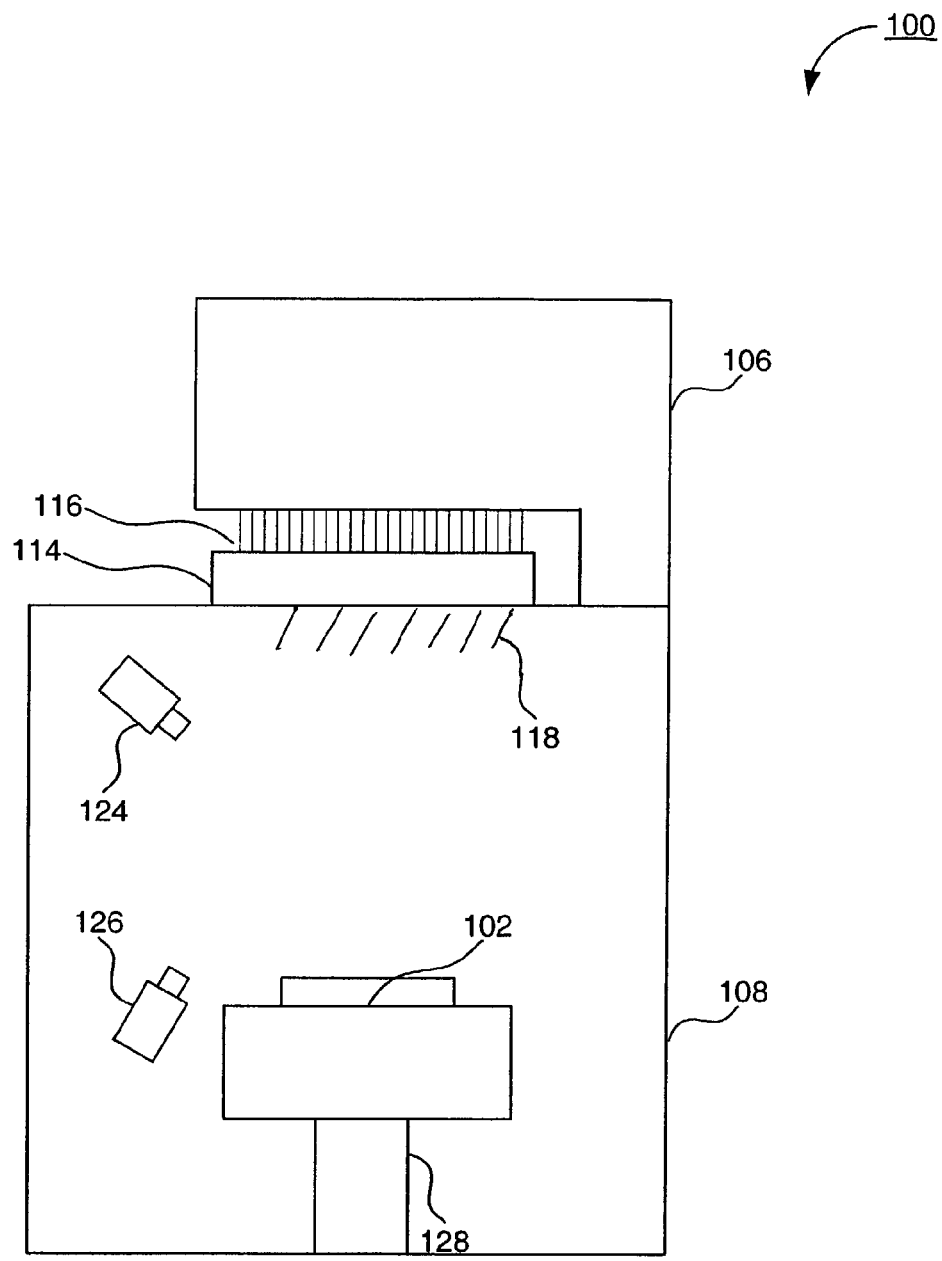
FIG. 2 shows a side view looking into line 2-2 in FIG. 1.

FIGS. 1 and 2 illustrate a front and side view, respectively, of a system 100 for testing an object 102, which can be a semiconductor wafer. The system 100 includes a tester 104, a test head 106, and a prober 108. The tester 104 is coupled to the test head 106 via a first communications cable 110 and to the prober 108 via a second communications cable 112. The test head 106 includes a probe card 114 coupled to the test head 106 via electrical connections 116. When the test head 106 is coupled to the prober 108, probes 118 extend into the prober 108 from the probe card 114. The prober 108 includes a substrate boat 120, a robotic arm 122, cameras 124 and 126, and a stage 128 that holds the substrate 102. The substrate boat 120 can store substrates 102 to be tested or that have been tested. The robotic arm 122 moves wafers between the stage 128 and the substrate boat 120.

The tester 104 controls the testing processes. It generates test data, which is sent to the test head 106 via the first communication cable 110 and receives response data from the test head 106 via the first communication cable 110. The tester 104 can be a computer or the like. Also, the tester 104 can control the prober 108 via the second communications cable 112.

The test head 106 receives test data from the tester 104 and passes the test data through the probe card 114 to the substrate 102. The test head 106 also receives through the probe card 114 response data generated by the substrate 102 and sends the response data to the tester 104 via the first communications cable 110.

The stage 128 supports the substrate 102 being tested. The stage 128 can move vertically and horizontally and can be tilted and rotated in some environments. The stage 128 moves the substrate 102 being tested against the probes 118. A camera 124 is used by prober 108 to identify alignment marks (not shown) on substrate 102 to aid in properly positioning substrate 102 relative to probe card 114. A camera 126 can also be used to detect an image of the probes 118.

Probe Cleaning System and Operation

In embodiments of the present invention, a probe cleaning device 300 (FIGS. 3A and 4A) or 350 (FIGS. 3B and 4B) is used in the system 100 in place of the substrate 102. The probe cleaning device 300 or 350 can be a cleaning wafer that includes a cleaning gel 302 or 352 that overlays a support substrate 304 or 354. In some embodiments the cleaning wafer can also include an abrasive layer 306 or 356, where an example of such a cleaning wafer is described in U.S. application Ser. No. 10/050,908 (the '908 application), filed Jan. 18, 2002 (now pending), which is incorporated herein by reference in its entirety.

As described above, cleaning the probes 118 involves placing the cleaning wafer 300 on the stage 128 and moving the stage 128 into contact with the probes 118, such that probes 118 are inserted into and then removed from the cleaning gel 302 or 352. According to some embodiments of the present invention, for example as disclosed in the cleaning wafer described in the '908 application, the probes 118 are also pressed against the abrasive surface 306 or 356 on the substrate 304 or 354. It is important that, in moving the stage 128 into contact with the probes 118, the stage 128 not be over or under driven against the cleaning wafer 300 or 350. If the stage 128 is stopped short of the probes 118 actually contacting the cleaning gel 302 or 352 or the abrasive surface 306 or 356 the probes 118 will not be cleaned. However, if the stage 128 over drives the probes 118 against the cleaning wafer 300 or 350, the probes 118 could be driven through the gel 302 or 352 and smashed against the gel's support substrate 304 or 354, damaging the probes 118. Camera 124 in prober 108 is used to monitor the location of the probes 118 with respect to a surface 308 or 358 of the cleaning gel 302 or 352. As mentioned above, it is sometimes difficult for camera 124 to detect the top surface 308 or 358 of the gel 302 or 352.

As seen in FIGS. 3A-3B and 4A-4B, embodiments of the cleaning wafers 300 or 350 of the present invention overcome this problem. The cleaning wafers 300 and 350 according to embodiments of the present invention include a predetermined finish 310 and 360 that allows camera 124 to automatically focus on the surface 308 or 358 during the cleaning process. According to the various embodiments, the predetermined finish 310 or 360 can be a machined finish, a textured finish, a marking, or the like. For example, the mark can be 5 µm RMS or less. Of course, the invention is not limited to such size marks, so any sized mark can be used.

Figure 3A:
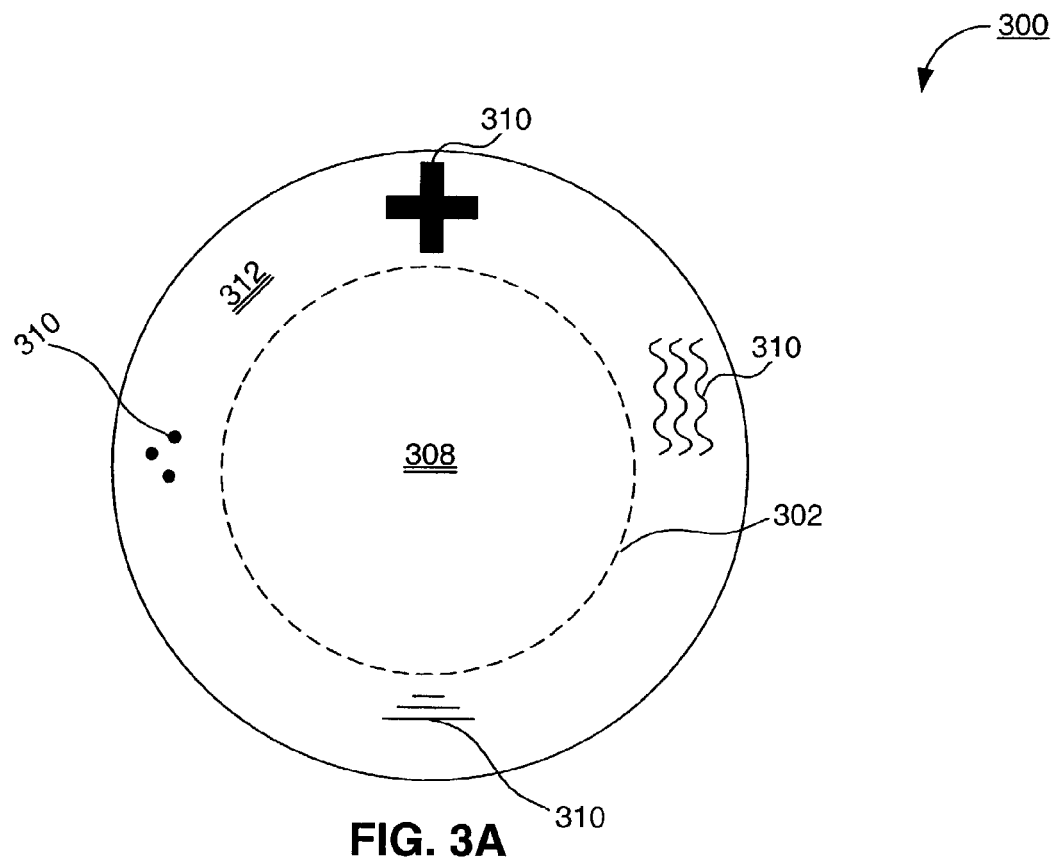
FIGS. 3A-3B show a top view of example cleaning devices according to embodiments of the present invention.
Figure 4A:
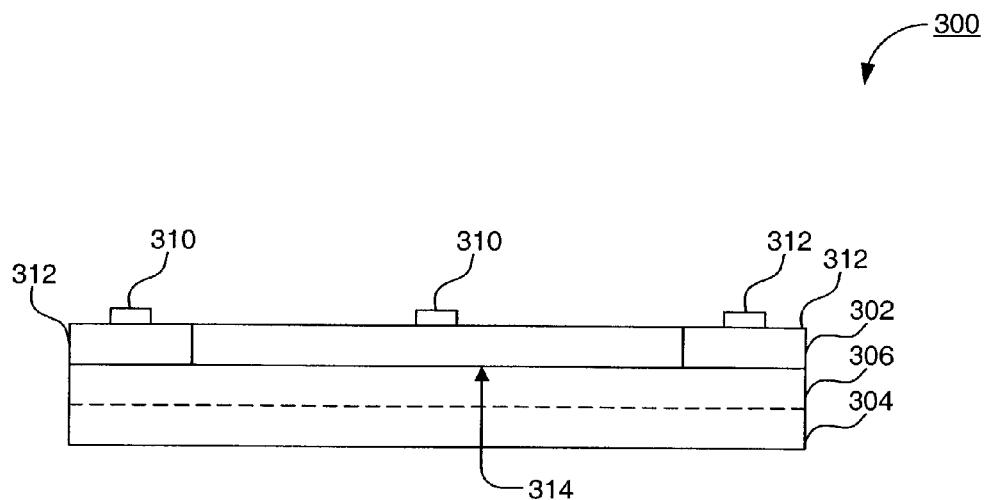
FIG. 4A shows a side view of the cleaning device in FIG. 3A.

In the embodiments shown in FIGS. 3A and 4A, the predetermined finish 310 can be a cross, a set of dots, a set of straight lines, a set of squiggly lines, a word, a symbol, a scratch, an abrasion, an indentation, or the like. Basically, the predetermined finish 310 can be any marking that has a color, a shape, or that provides some sort of discontinuity on the surface 308 of the gel 302 and that provides a contrast with the remaining portion of the surface 308 of the gel 302. This contrast allows camera 124 to automatically focus on the surface 308 of the gel 302. In some embodiments, the predetermined finish 310 can be located in a predetermined area 312. The predetermined area 312 can be in a peripheral area of the cleaning wafer 300 or in any location where the probes 118 do not interact with the gel 302 or the abrasive layer 306.

Figure 3B:
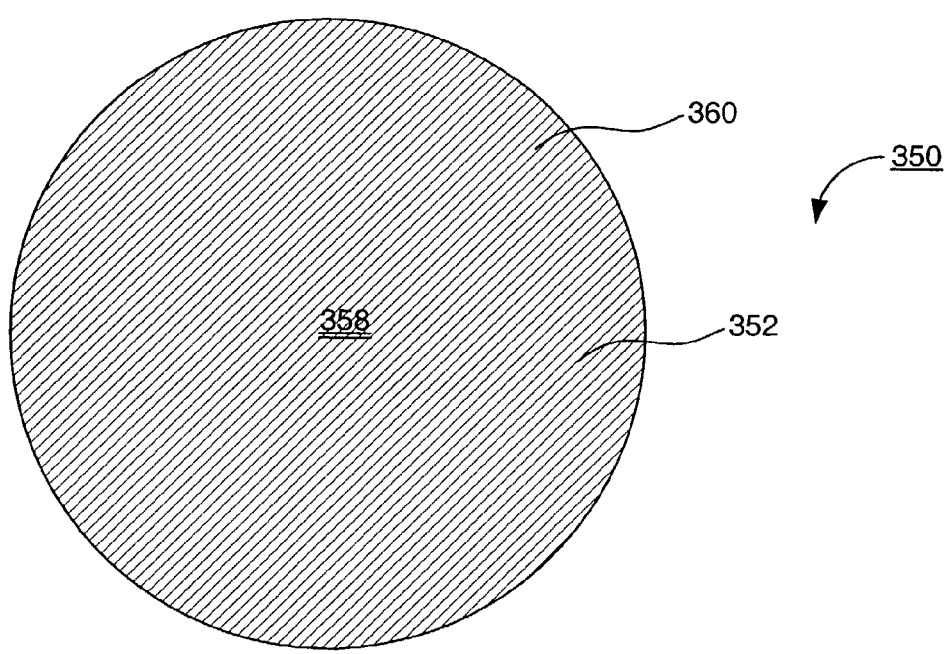
Figure 4B:
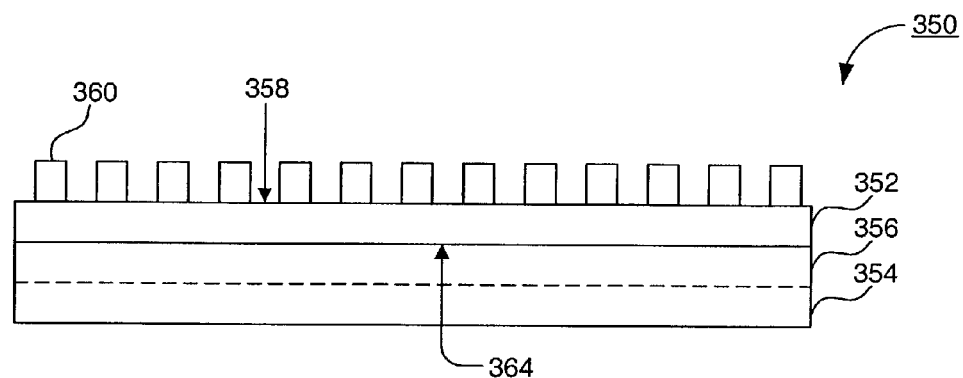
FIG. 4B shows a side view of the cleaning device in FIG. 3B.

In the embodiment shown in FIGS. 3B and 4B, the predetermined finish 360 can be any periodic or non-periodic texture encompassing all or some of the surface 358 of the gel 352. The texture can be a color, a shape, or any mark that provides a discontinuity on the surface 358 of the gel 352 and that provides a contrast with the remaining portion of the surface 358 of the gel 352. This contrast allows camera 124 to automatically focus on the surface 360 of the gel 352.

Method of Making a Probe Cleaning Device

Figure 5:
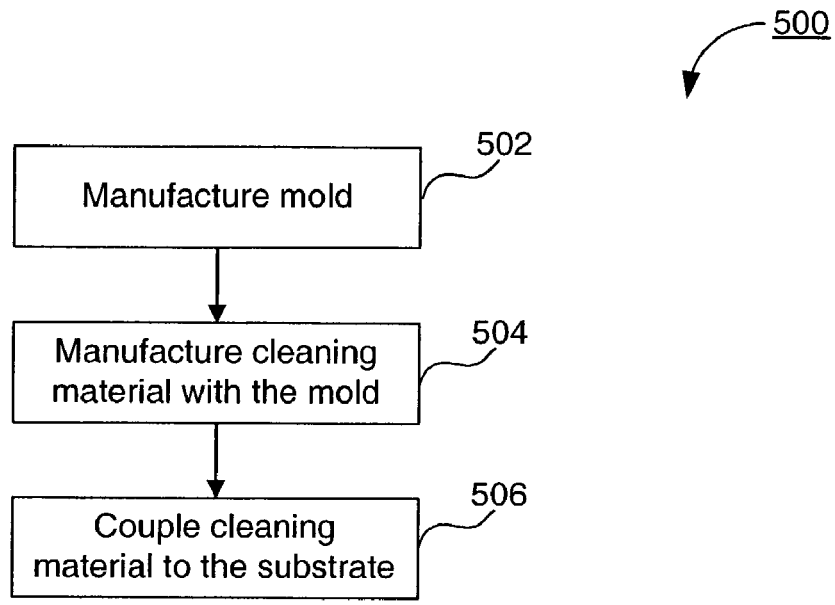
FIG. 5 shows a method of making a probe cleaning device according to embodiments of the present invention.
Figure 6:
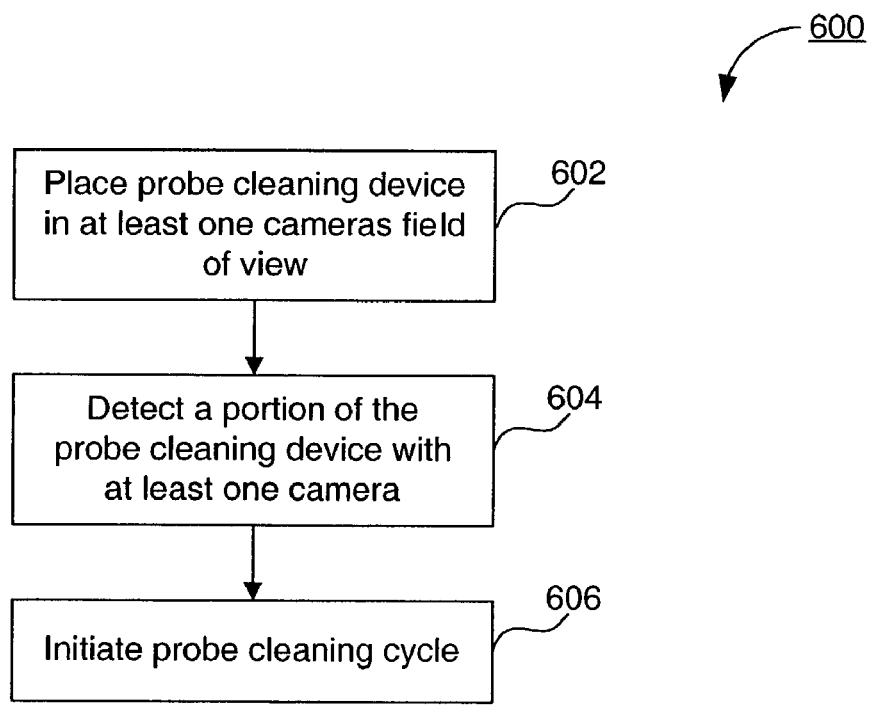
FIG. 6 shows a method of cleaning probes with a probe cleaning device according to embodiments of the present invention.

FIG. 5 shows a method 500 of making a cleaning device 300 or 350 according to an embodiment of the present invention (steps 502-506). At step 502 a mold having a mold surface that produces a predetermined surface finish is manufactured. At step 504 a cleaning material, which can be gel 302 or 352, is manufactured with the mold. A surface 308 or 358 of the cleaning material 302 or 352 includes the predetermined surface finish 310 or 360. The predetermined surface finish 310 or 360 allows camera 124 to automatically focus on the surface 308 or 358 during a cleaning process 600 (FIG. 6). At step 506 a surface 314 or 364 of the cleaning material 302 or 352 is coupled to the substrate 304 or 354. The cleaning material 302 or 352 can be coupled either directly or indirectly through the abrasive layer 306 or 356 to the substrate 304 or 354.

In alternative embodiments, instead of molding a mark into the gel, a gel having a smooth surface can be marked with ink or have indentations cut into the surface by abrading, scratching, cutting, stamping, laser marking, or the like.

Method of Cleaning a Probe with a Probe Cleaning Device

FIG. 6 shows a method 600 for cleaning the probes 118 in a system 100 (steps 602-606). At step 602 a probe cleaning device 300 or 350 having the surface 308/310 or 358/360 that provides contrast is placed in a field of view of camera 124. At step 604 camera 124 detects the probe cleaning device 300 or 350. Moving the probe cleaning device 300 or 350 relative to camera 124 until camera 124 detects an in-focus condition can cause this detection. The in-focus condition can be when the surface 308 or 358 is at a predetermined position that is in-focus within the field of view of camera 124. In other embodiments, the detection can be made with no relative movement of the probe cleaning device 300 or 350 and camera 124. At step 606 a probe cleaning cycle is initiated once the camera has detected the in-focus condition. During the probe cleaning cycle the probes 118 are brought into contact with at least the surface 308 or 358 of the probe cleaning device 300 or 350 based on the predetermined position of the surface 308 or 358 relative to the probes 118.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A probe cleaning device, comprising:
a substrate layer; and
a continuous gel layer coupled to said substrate layer, said gel layer having a surface with a predetermined finish comprising a discontinuity on said surface sufficiently distinct for a camera to automatically focus on said surface during a cleaning process.

2. The probe cleaning device of claim 1, wherein said predetermined finish comprises a textured finish and said textured finish comprises said discontinuity.

3. The probe cleaning device of claim 2, wherein said textured finish comprises a periodic pattern in which said discontinuity is repeated on said surface.

4. The probe cleaning device of claim 1, wherein said discontinuity is disposed in a predetermined section of said surface that is not contacted by probes during said cleaning process.

5. The probe cleaning device of claim 4, wherein the predetermined section is a peripheral section.

6. The probe cleaning device of claim 1, wherein said surface has said predetermined finish prior to use of said gel layer to clean probes.

7. The probe cleaning device of claim 1, wherein said gel comprises a cleaning gel.

8. The probe cleaning device of claim 1 further comprising an abrasive layer positioned between said substrate layer and said gel layer.

9. A probe cleaning device, comprising:
a substrate layer; and
a continuous gel layer coupled to said substrate layer, said gel layer having a surface with a marking on said surface, said marking being sufficiently distinct for a camera to automatically focus on said surface during a cleaning process,
wherein said marking is in a predetermined section of said surface that is not contacted by probes during said cleaning process.

10. The probe cleaning device of claim 9, further comprising an abrasive layer positioned between the substrate layer and said gel layer.

11. The probe cleaning device of claim 9, wherein said marking has at least one of a color or shape that provides a contrast with a remaining portion of said surface.

12. The probe cleaning device of claim 9, wherein said predetermined section is a peripheral section of said surface.

13. The probe cleaning device of claim 9, wherein said marking is less than 5 μm RMS.

14. The probe cleaning device of claim 9, wherein said surface has said marking prior to use of said gel layer to clean probes.

15. The probe cleaning device of claim 9, wherein said gel comprises a cleaning gel.

16. A probe cleaning device, comprising:
a substrate layer; and
a continuous gel layer coupled to said substrate layer, said gel layer having a surface with a discontinuity disposed on an unbroken portion of said surface, said discontinuity being sufficiently distinct for a camera to automatically focus on said surface during a cleaning process.

17. The probe cleaning device of claim 16, wherein said surface comprises a textured surface portion, said textured surface portion comprising said discontinuity.

18. The probe cleaning device of claim 16, wherein the probe cleaning device cleans probes when the gel layer is brought into contact with the probes during a cleaning process.

19. The probe cleaning device of claim 16, wherein the substrate layer and the gel layer together comprise a wafer.

20. The probe cleaning device of claim 16, wherein said surface has said discontinuity prior to use of said gel layer to clean probes.

21. The probe cleaning device of claim 17, wherein said textured surface portion comprises a periodic pattern in which said discontinuity is repeated on said surface.

22. The probe cleaning device of claim 16, wherein said discontinuity is disposed in a predetermined section of said surface that is not contacted by probes during said cleaning process.

23. The probe cleaning device of claim 22, wherein the predetermined section is a peripheral section.

24. The probe cleaning device of claim 16, wherein:
said discontinuity comprises one or more contours on said surface that correspond to contours of a mold in which said surface was formed, and
another surface of said gel layer is attached to said substrate layer, said another surface is opposite said surface on which said contours are located.

25. The probe cleaning device of claim 16, wherein said gel comprises a cleaning gel.

26. The probe cleaning device of claim 16 further comprising an abrasive layer positioned between said substrate layer and said gel layer.

* * * * *